United States Patent
Wen et al.

(10) Patent No.: US 7,508,211 B2
(45) Date of Patent: Mar. 24, 2009

(54) REGULARIZED SPECIES SEPARATION

(75) Inventors: Zhifei Wen, Madison, WI (US); Angel R. Pineda, Fullerton, CA (US); Huanzhou Yu, Mountain View, CA (US); Scott B. Reeder, Middleton, WI (US); Norbert J. Pelc, Los Altos, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/738,345

(22) Filed: Apr. 20, 2007

(65) Prior Publication Data

US 2007/0285091 A1    Dec. 13, 2007

Related U.S. Application Data

(60) Provisional application No. 60/745,602, filed on Apr. 25, 2006.

(51) Int. Cl.
    *G01V 3/00* (2006.01)
(52) U.S. Cl. .................... 324/318; 324/309
(58) Field of Classification Search ......... 324/300–322; 600/407–422
    See application file for complete search history.

(56) References Cited

U.S. PATENT DOCUMENTS

| | | | |
|---|---|---|---|
| 5,910,728 | A | 6/1999 | Sodickson |
| 6,252,979 | B1 * | 6/2001 | Lee et al. ............... 382/133 |
| 6,289,232 | B1 | 9/2001 | Jakob et al. |
| 6,377,045 | B1 * | 4/2002 | Van Den Brink et al. .... 324/307 |
| 6,605,943 | B1 | 8/2003 | Clark et al. |
| 6,714,010 | B2 | 3/2004 | Madore |
| 6,836,114 | B2 | 12/2004 | Reddy et al. |
| 7,199,583 | B2 * | 4/2007 | Ikezaki ................. 324/309 |
| 7,298,144 | B2 * | 11/2007 | Reeder et al. ............. 324/307 |
| 7,349,729 | B2 * | 3/2008 | Reeder et al. ............. 600/410 |

OTHER PUBLICATIONS

An et al., "Chemical Shift Imaging with Spectrum Modeling", Magn. Reson. Med. (2001) 46(1):126-130.

An et al., "Water-Fat Imaging with Three Orthogonal-Phase Acquisitions", Proceedings 6th Scienctific Meeting, International Society for Magnetic Resonance in Medicine (1998), 1866.

Brau et al., "Accelerated IDEAL Water-Fat Separation Techniques for Single- and Multi-Coil Applications", Proc. Intl. Soc. Mag. Reson. Med. 13 (2005) p. 491.

Bydder et al., "Fat Quantification by Modeling the Variation in Signal Amplitude with TE", Proc. Intl. Soc. Mag. Reson. Med. 14 (2006) p. 2298.

Dixon, "Simple Proton Spectroscopic Imaging", Radiology (1984) 153:189-194.

Fernandez-Real et al., "Cross-Talk between Iron Metabolism and Diabetes", Diabetes (2002), 51(8):2348-2354.

(Continued)

*Primary Examiner*—Brij B Shrivastav
(74) *Attorney, Agent, or Firm*—Beyer Law Group LLP

(57) ABSTRACT

A method for generating a magnetic resonance images is provided. A magnetic resonance imaging excitation is applied. A plurality of magnetic resonance image signals is acquired. The plurality of image signals is combined iteratively by using a regularized decomposition algorithm. An image created from combining the plurality of image signals iteratively is displayed.

20 Claims, 5 Drawing Sheets

OTHER PUBLICATIONS

George et al., "Increased Hepatic Iron Concentration in Nonalcoholic Steatohepatitis is Associated with Increased Fibrosis", Gastroenterology (1998), 114(2):311-318.

Glover, G., "Multipoint Dixon Technique for Water and Fat Proton and Susceptibility Imaging", Journal of Magnetic Resonance Imaging (1991), 1:521-530.

McKenzie et al., "Abdominal Three Point Imaging with Self Calibrating Parallel MRI", in Proc. Intl. Soc. Mag. Reson. Med. 11 (2004), p. 917.

Moirand et al., "A New Syndrome of Liver Iron Overload with Normal Transferin Saturation", The Lancet (1997); 349 (9045):95-97.

Pineda et al., "Cramer-Rao Bounds for Three-Point Decomposition of Water and Fat", Magn. Reson. Med. (2005) 54(3):625-635.

Reeder et al., "Iterative Decomposition of Water and Fat with Echo Asymmetry and Least-Squares Estimation (IDEAL): Application with Fast Spin-Echo Imaging", Magn. Reson. Med. (2005), 54(3):636-644.

Reeder et al., "Multicoil Dixon Chemical Species Separation with an Iterative Least-Squares Estimation Method", Magn. Reson. Med. (2004) 51:35-45.

Westphalen et al., "Liver Fat: Effect of Hepatic Iron Deposition on Evaluation with Opposed-Phase MR Imaging", Radiology (2007), 242(2):450-455.

Wieben et al., "Multi-Echo Balanced SSFP Imaging for Iterative Dixon Reconstruction", Proc. Intl. Soc. Mag. Reson. Med. 13 (2005), p. 2386.

Yu et al., "Field Map Estimation with a Region Growing Scheme for Iterative 3-Point Water-Fat Decomposition", Magn. Reson. Med. (2005) 54(3):1032-1039.

Yu et al., "Single Acquisition Water-Fat Separation: Feasibility Study for Dynamic Imaging", Magn. Reson. Med. (2006) 55(2): 413-422.

Yu et al., "Single Quadrature Echo Water-Fat Separation with Robust Phase Correction", Proc. Intl. Soc. Mag. Reson. Med. 14 (2006), p. 2446.

U.S. Appl. No. 10/690,230, by Reeder et al. entitled "Magnetic Resonance Imaging of Different Chemical Species in a System Having Magnetic Field Heterogeneities", filed on Oct. 23, 2003 (published).

Office Action dated May 28, 2008 from U.S. Appl. No. 11/738,350.

Notice of Allowance dated Aug. 22, 2008 from U.S. Appl. No. 11/738,350.

* cited by examiner

REGULARIZED SPECIES SEPARATION

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES, which is incorporated herein by reference for all purposes.

GOVERNMENT RIGHTS

The U.S. government has rights in the disclosed invention pursuant to NIH Grant No. P41RR09784 to Stanford University.

BACKGROUND OF THE INVENTION

This invention relates generally to magnetic resonance imaging (MRI) of an object having different chemical species therein, such as fat and water, and more particularly the invention relates to species imaging in the presence of magnetic field ($B_o$) heterogeneity.

Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underline pathology. Although conventional fat saturation may be adequate for areas of the body with relative homogeneous $B_o$ field, there may be many applications in which fat saturation routinely fails. This is particularly true for extremity imaging, off-isocenter imaging, large field of view (FOV) imaging, and challenging areas such as the brachial plexus and skull base, as well as many others. Short-TI inversion recovery (STIR) imaging provides uniform fat suppression, but at a cost of reduced signal-to-noise ratio (SNR) and mixed contrast that is dependent on $T_1$. This latter disadvantage limits STIR imaging to $T_2$ weighted ($T_2W$) applications, such that current $T_1$ weighted ($T_1W$) applications rely solely on conventional fat-saturation methods. Another fat suppression technique is the use of spectral-spatial or water selective pulses; however, this method is also sensitive to field inhomogeneities.

"In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

SUMMARY OF THE INVENTION

To achieve the foregoing and in accordance with the purpose of the present invention, a method for generating a magnetic resonance images is provided. A magnetic resonance imaging excitation is applied. A plurality of magnetic resonance image signals is acquired. The plurality of image signals is combined iteratively by using a regularized decomposition algorithm.

In another manifestation of the invention, an apparatus for providing magnetic resonance images is provided. A magnet system is provided. A controller is electrically connected to the magnet system and comprises a display, at least one processor, and computer readable media. The computer readable media comprises computer readable code for signaling the magnetic system to apply a magnetic resonance imaging excitation, computer readable code for signaling the magnetic system to acquire a plurality of magnetic resonance image signals, computer readable codes for combining the plurality of image signals iteratively by using a regularized decomposition algorithm, and computer readable code for displaying an image created from combining the plurality of image signals iteratively.

The invention, objects, and features thereof will be more readily apparent from the following detailed description and appended claims when taken with the drawings.

DETAILED DESCRIPTION OF ILLUSTRATED EMBODIMENTS

Figure 1:
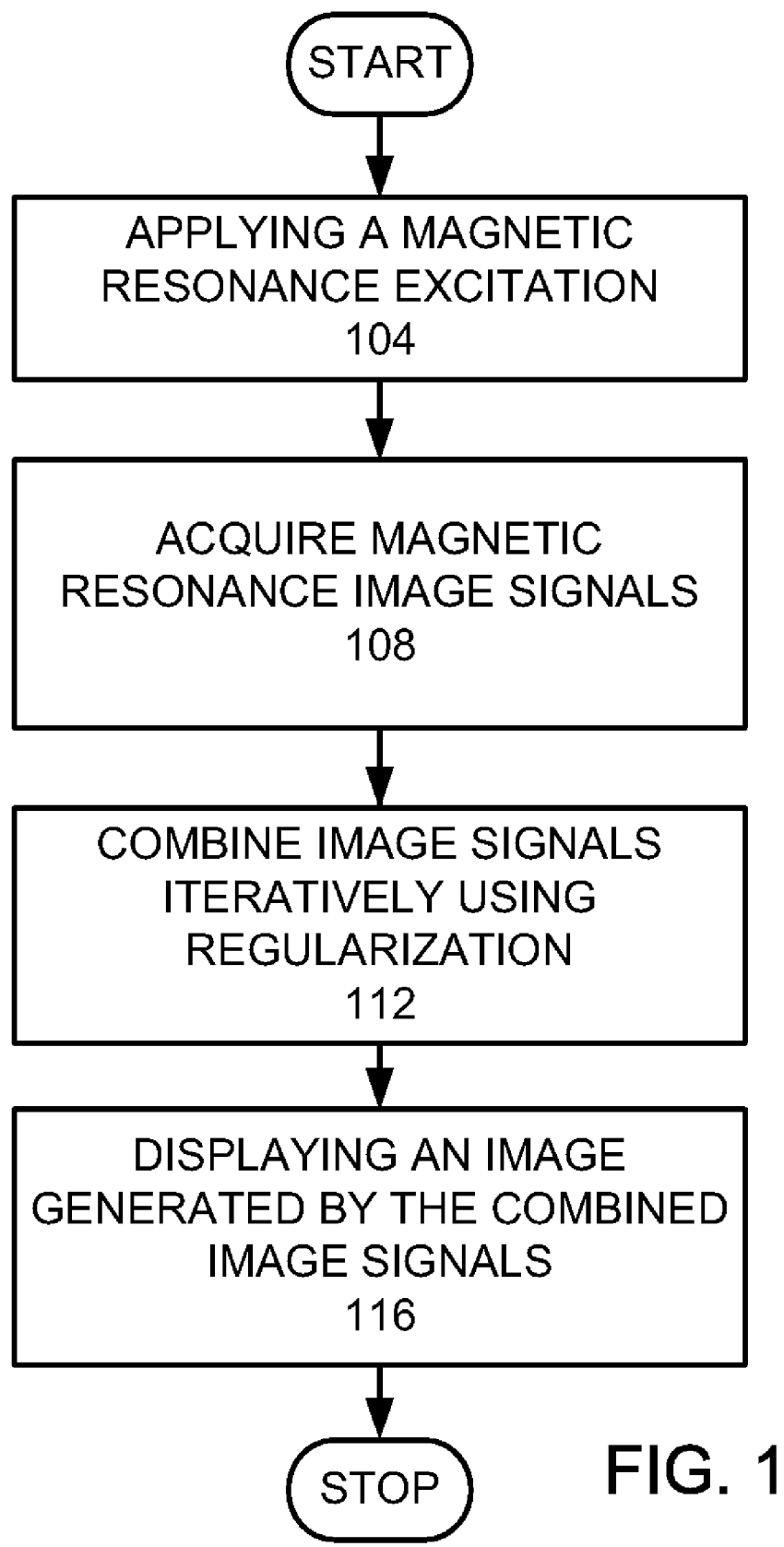
FIG. 1 is a high level flow chart of an embodiment of the invention.

A common problem of least-squares estimation is the noise amplification that occurs when the noise distribution in the data is not perfectly Gaussian or when the model does not exactly describe the data. FIG. 1 is a high level flow chart of a process according to an embodiment of the invention. In this manifestation, the process comprises applying a magnetic resonance excitation (step 104), acquiring magnetic resonance image signals (step 108), combining the magnetic resonance image signals iteratively using regularization (step 112), and displaying an image generated by the combined image signals (step 116).

Figure 2:
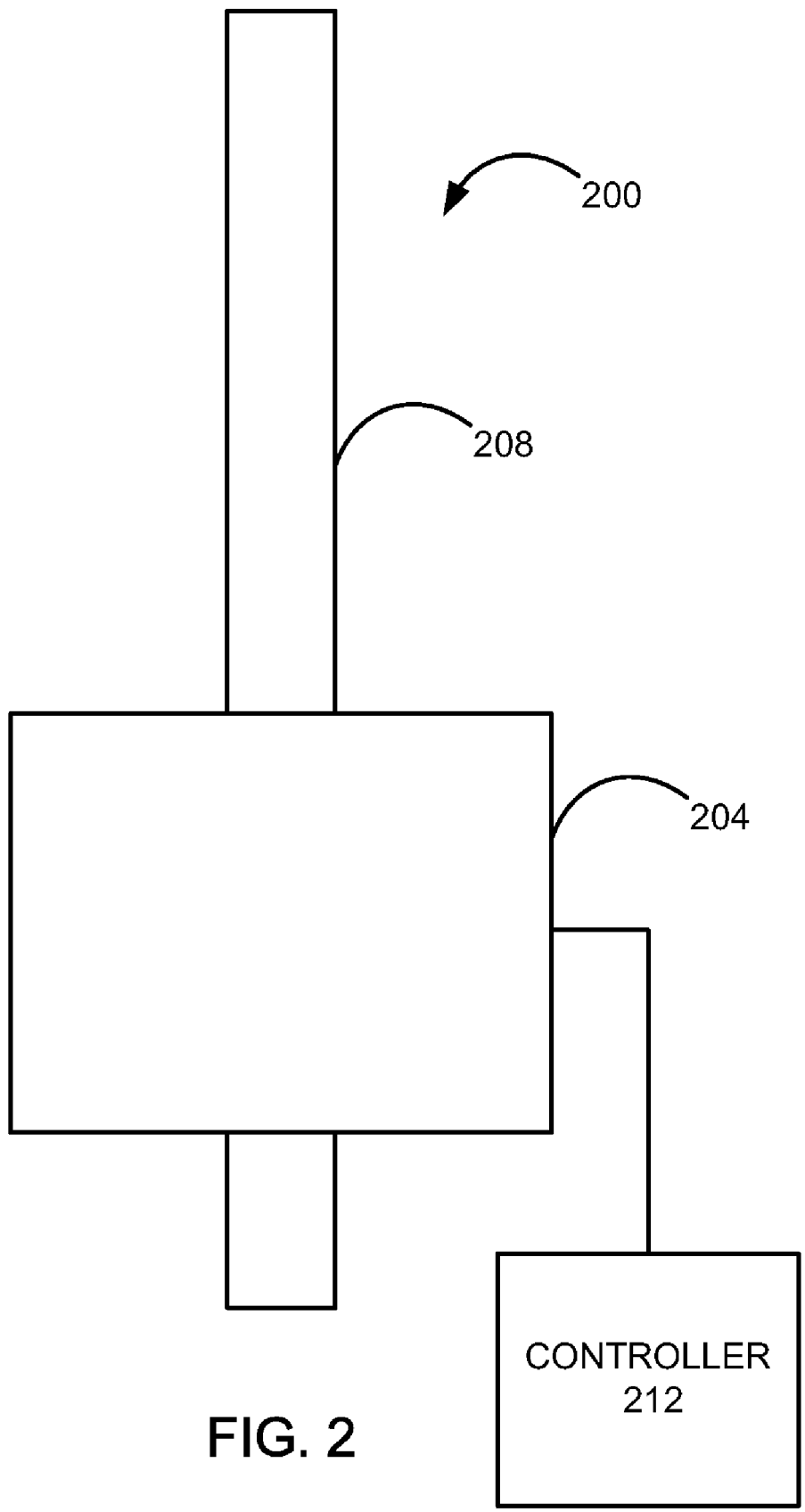
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 surrounds at least a portion of the patient. The controller 212 controls the application of magnetic fields and radio frequency (RF) signals within the magnet system 204 and receives signals from detectors in the magnet system 204.

Figure 3A:
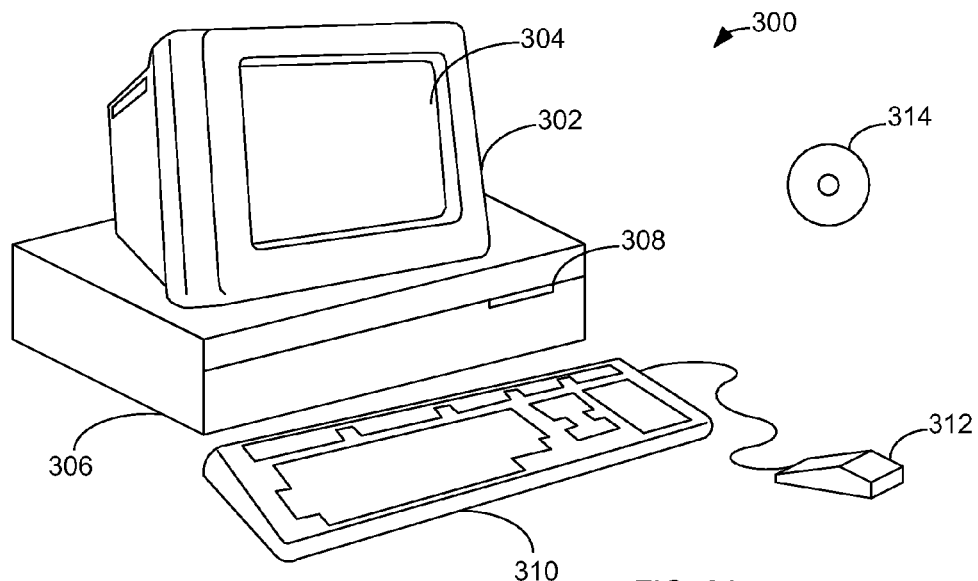
FIGS. 3A and 3B illustrate a computer system, which is suitable for implementing a controller 212 used in embodiments of the present invention.
Figure 3B:
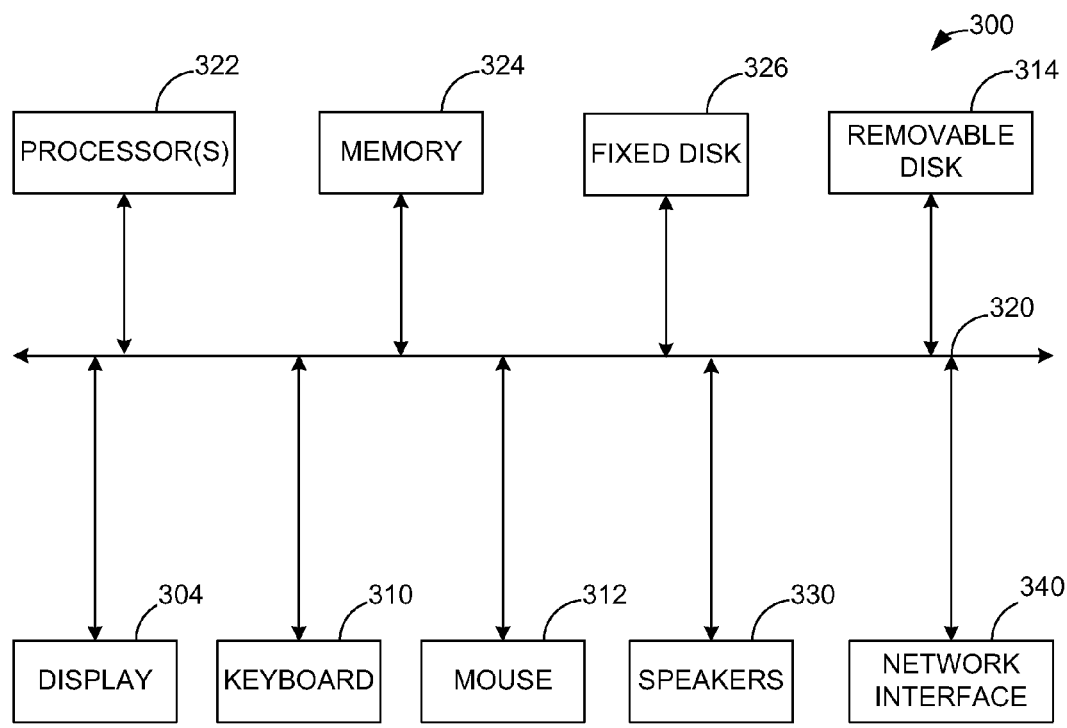

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small handheld device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as optical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In an example of combining image signals iteratively using regularization, a small amount of regularization often results in images with much less susceptibility to noise and a small (and clinically acceptable) bias. One example of implementing a regularization technique is to minimize a modified least squares function that explicitly includes a regularizing term:

$$\sum_{n=1}^{N} \frac{(g_n - S_n(p))^2}{\sigma_n^2} + \text{Regularization Term} \left( \alpha \sum_{n=1}^{N} |p|^2 \right) \quad \text{EQ. 1}$$

For equation 1, the first term is a least squares term and the second term is a regularization term. For the purposes of illustration, this example uses the Tikhonov regularization term with a regularizing parameter $\alpha$. This regularization term imposes a priori knowledge about the parameters being estimated. In the Tikhonov case, the regularizing term biases the solution toward small values of the parameters. The regularization parameter controls the relative strength of the prior information.

The a priori knowledge or assumption can be used in the regularization. One example is that the field inhomogeneity (field map) is spatially smooth. The smoothing is enforced by considering or averaging the field map in several pixels together. Therefore, instead of an implementation of IDEAL that involves a single pixel, this example uses several pixels, which are considered at a time, so that regularizing terms impose smoothness of the parameters of interest across pixels. In particular, smoothness is imposed on the field map frequencies for the reconstructions. An example is illustrated in EQ. 2, where p represents the field map at the pixel to be estimated, and $\hat{p}$ denotes the averaged field map from neighboring pixels. The least squares estimation thus will select a solution in which the difference of the field map between neighboring pixels is small (i.e. smoothness)

$$\sum_{n=1}^{N} \frac{(g_n - S_n(p))^2}{\sigma_n^2} + \text{Regularization Term} \left( \alpha \sum_{n=1}^{N} |p - \hat{p}|^2 \right) \quad \text{EQ. 2}$$

In an example, a Monte Carlo simulation is used to show how, assuming that the field map is smooth, and enforcing that constraint where the assumption is correct can improve the effective NSA (Number of Signal Averages) from the case were the field map is unknown to where the field map is known for a symmetric acquisition (−ΔTE,0,ΔTE) for a pixel that only has water. The effective NSA is a measure of the noise performance of the method, and is described in more detail below.

The field maps during the iterative reconstruction were smoothed with increasingly larger blurring kernels (averaging larger number of pixels together). As the amount of blurring increased, the uncertainty due to the field map decreased. As long as the assumption of a smooth field map is valid, this type of prior information or regularization can be very useful. In the alternative, to obtain a smooth field map, the source input may be smoothed before the iterative estimation in such a way as to provide a smoothed field map. In another alternative, instead of smoothing the field map in image domain by small kernel filters, the smooth field map can be obtained by applying a low pass filter in Fourier transform domain. Generally, a low pass filter is applied to the input to obtain a spatially, slowly varying (smoothed) field map. In another alternative, a spatial feature of the field map, such as a linear spatial dependence, may be known or assumed a priori. The regularization would be achieved by enforcing the estimated field map to have this known feature.

Figure 4:
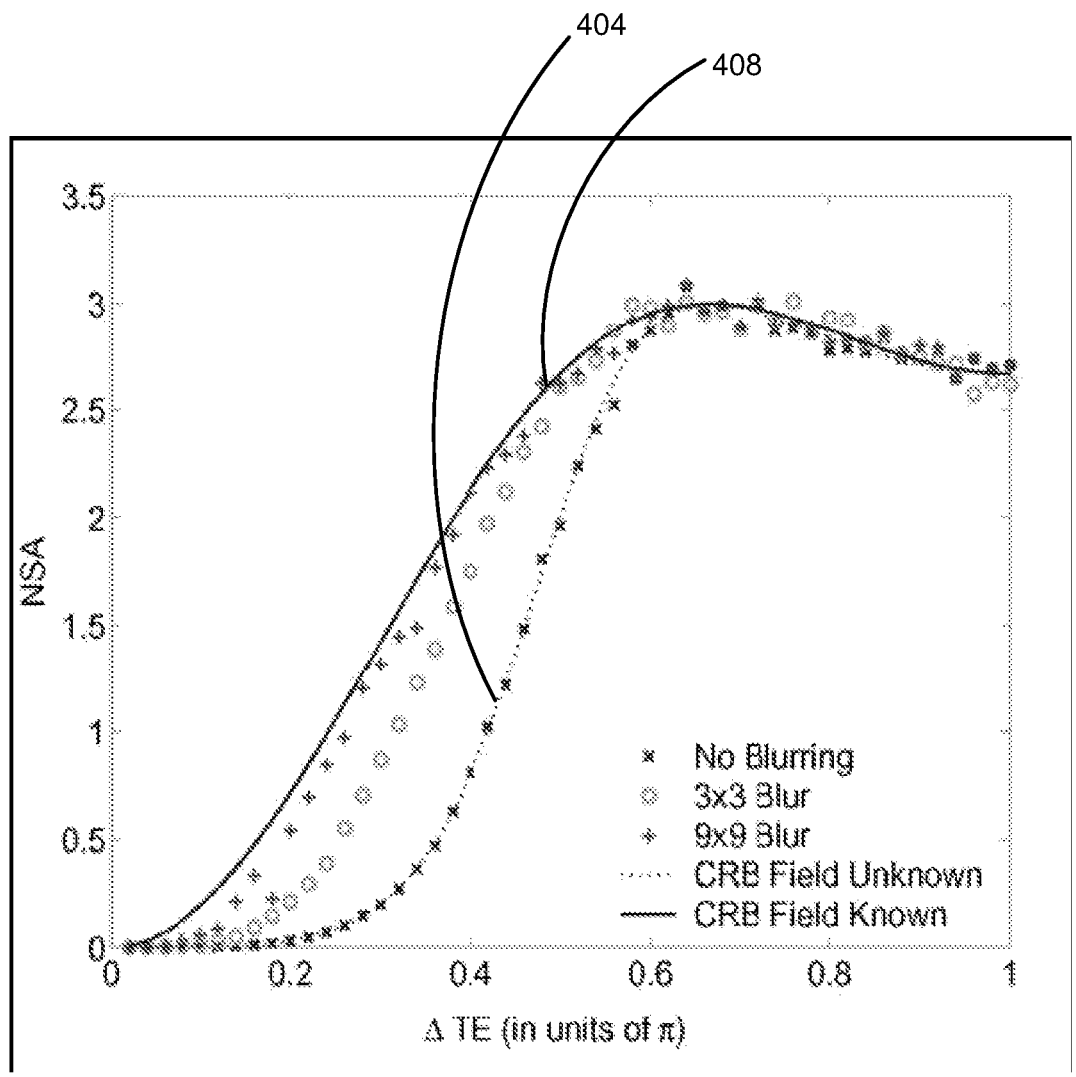
FIG. 4 is a plot of NSA for various amounts of field map smoothing.

FIG. 4 illustrates a plot of NSA (scale 0-3) vs. ΔTE, for a pixel that only has water within it. The vertical axis is a measure of noise efficiency (NSA). The horizontal axis indicates the amount of time to collect the data. A higher value of NSA is desirable. The first curve 404 provides the best possible noise performance that can be achieved by an estimator with the field map unknown and using no a priori knowledge. The curve indicated by the "×" uses no blurring, so that each individual pixel value is used and matches the 404 curve. A second curve 408 provides the best possible noise performance if the field map is known. The dotted line is derived from points indicated by the "+", which use 9×9 blurring from an averaging of a group of points and matches the best possible theoretically derived noise performance of curve 408. Points for a 3×3 blurring are indicated by the "o". In this example, a field map is calculated and then the blurring is achieved by averaging a group of pixels together, for example, averaging pixels in a 9×9 pixel area together. At different ΔTE values, for example at 0.4 on the horizontal, the different curves provide different NSA values. The difference in the height of the curves is due to regularization, so that regularization moves the first curve 404, where nothing is known about the field map, to near the second curve 408, where the field map is known. The more regularization, the better the noise performance, as long as the assumption for the regularization is valid. Blurring or averaging a larger number of points together increases a presumption that the field map is slowly varying. So in this example, the a priori knowledge is that the field map is slowly varying.

In other alternatives, phase may be regularized by providing phase smoothing. In the application and claims, noise optimization and regularization will be used interchangeably.

In another embodiment, the a priori information for regularization is that the water and fat magnitudes are not large. In such an example, an equation, such as Equation 1, would replace "p" with the water and fat intensities, which minimizes the water and fat intensities as well as least square errors. In such an example, the field map does not need to be smoothed, but field map smoothing could be applied as well. In such embodiments, where the noise is Gaussian, an iterative regularized least squares process is used. In other processes where the noise has other distributions, such at a Rician or Poisson distribution, other maximum likelihood estimation processes that include regularization processes would be used. A regularized decomposition algorithm that uses maximum likelihood estimation may use a generalized function to be maximized, such as P(g|p)+Regularization term, where P(g|p) is the probability of observing the data g from the parameters p. Least squares reconstruction is a specific example of this function with a Gaussian probability noise model.

In an example, the combining of the image signals iteratively using regularization is used to separate a first species, such as fat, from a second species, such as water.

Preferably, Dixon species separation, or iterative least-squared decomposition with echo asymmetry and least squares estimation (IDEAL), is used to acquire the magnetic resonance data and generate the fat species and the water species. In other embodiments, other processes are used.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

More specific details regarding implementation of various embodiments are discussed below.

It was demonstrated that the decomposition of water from fat with symmetrically acquired echoes cannot be achieved when the proportions of water and fat within a voxel are approximately equal. A complete characterization of the theoretical maximum noise performance of water-fat decomposition, including the effects of the field inhomogeneities estimation, was reported in A. Pineda, S. Reeder, Z. Wen, H. Yu, N. Pelc Cramer-Rao, "Bounds for 3-Point Decomposition of Water and Fat", Magn. Reson. Med. (2005) 54(3):625-635 (hereinafter Pineda et al.). This work showed that the theoretical ability of all water-fat separation methods to decompose water from fat in a voxel is dependent on the relative proportions of water and fat, as well as the position of acquired echoes relative to the spin-echo. The dependence on the proportions of water and fat is particularly true for echoes that are acquired symmetrically about the spin-echo. This theory has been extended to spoiled gradient echo imaging (SPGR).

Optimal echo times predicted by Pineda et al. acquire the second of the three echoes in quadrature, re: the phase between the water and fat is such that water and fat are perpendicular to one another i.e. $\pi/2+\pi k$, k=any integer. The first and third echoes are subsequently acquired $2\pi/3$ before and after the second echo, respectively. Such echo combinations have been shown to provide the optimal noise performance for a fat-water separation acquisition. The use of different k-groups permits great flexibility with pulse sequences such as spoiled gradient echo imaging. This has been found and shown by the inventors to be an effective method at both 1.5 and 3.0 T.

In U.S. patent application Ser. No. 10/690,230, by Pelc and Reeder, entitled "Magnetic Resonance Imaging of Different Chemical Species in a System Having a Magnetic Field Heterogeneities" filed on Oct. 20, 2003, which is incorporated by reference for all purposes, teaches that using least squares.

Theory:

Noise Performance

The noise performance of a water-fat decomposition is conveniently described with the effective number of signal averages, or NSA, defined as $$NSA = \frac{\sigma^2}{\sigma_p^2} \qquad \text{EQ. 3}$$

where $\sigma^2$ is the variance of the noise in a source image and $\sigma_p^2$ is the variance of the noise in a calculated water or fat image. The NSA is a useful measure of the noise performance of a water-fat decomposition, and has an intuitive basis: For any three-point water-fat decomposition method, the maximum possible NSA is three, which is equivalent to what would be obtained if the object contained only water or only fat, and the three source images were averaged. EQ. 3 will be used experimentally to determine the noise performance of the IDEAL-GRE method.

Optimal Echo Shifts

The phase shift between water and fat from an echo acquired at time t relative to TE=0, can be written, $$\theta = 2\pi\Delta f t \qquad \text{EQ.4}$$

where $\Delta f$ is the chemical shift between water and fat (−210 Hz at 1.5 T and −420 Hz at 3.0 T). Phase shifts are more convenient than echo shifts, because they are independent of field strength and are more intuitive, providing more physical meaning to the water-fat separation problem.

As predicted by Pineda et al., one set of optimal echo shifts for the three images occurs when the water-fat phase is, $1^{st}$ echo: $-\pi/6+\pi k$ $2^{nd}$ echo: $\pi/2+\pi k$ $3^{rd}$ echo: $7\pi/6+\pi k$, $k$=any integer  EQ. 5

This echo combination has an intuitive basis as follows: In the "perfect" NMR experiment, there are no constant phase shifts or $B_o$ inhomogeneities, and an image acquired with an echo time that has water and fat in quadrature, i.e.: $\pi/2+\pi k$, can be used to separate water from fat with that single image: water and fat are simply the real and imaginary components of the complex image. However, the presence of unknown constant phase shifts and $B_o$ inhomogeneities requires additional information. The acquisition of two additional images $120°(2\pi/3)$ before and after the second echo located at $\pi/2+\pi k$ provides uniform sampling around the unit circle, providing the optimal noise performance in the estimation of water and fat from the three source images. It is important to note that this optimal performance occurs when the center echo is in quadrature; echo combinations with the first or third echo in quadrature will not have optimum noise performance.

Echo shifts that satisfy EQ. 5 will have optimal noise performance. However, noise performance is poor when the second echo is acquired when water and fat are aligned, i.e.: any multiple of $2\pi$, even if the spacing between all three echoes remains at $2\pi/3$. In this case, the NSA is three when a voxel contains all water, but is significantly reduced for voxels that contain all fat, and has a broad minimum approaching zero for voxels containing mixtures of water and fat in near equal proportions. This echo combination can lead to image artifacts that include irregular margins at the interface between tissues with water signal (e.g. muscle) and fat signal (e.g. subcutaneous fat), as a result of partial volume effects. In addition, areas of the calculated water image that contain mostly fat signal (e.g. bone marrow and subcutaneous fat) appear noisy.

The choice of echo group, determined by the echo group index k, will depend on the minimum TE ($TE_{min}$) of the sequence. Typically, k is chosen to minimize the echo times, but ensure that they are all greater than $TE_{min}$ (which may be limited by the components of the MRI system). For example, at 1.5 T one possible echo combination for IDEAL-GRE imaging occurs for k=1, with echo shifts of 2.0 ms, 3.6 ms and 5.2 ms, so long as $TE_{min}$ is 2.0 ms or less. It is worthwhile to note that spacing between echo groups decreases with increasing field strength: the time between consecutive echo groups at 1.5 T is approximately 2.4 ms compared to a spacing of 1.2 ms at 3.0 T. The decrease in time between echo groups, and the fact that echoes within a group are more closely spaced with increasing field strength, makes IDEAL more flexible and more efficient for imaging at 3.0 T.

Clinical Results

Figures 5A, 5B, 5C:
FIGS. 5A-C are images generated using an embodiment of the invention.

FIGS. 5A-C are images of a heart taken at different $\Delta TE$, which would normally lead to different noise efficiency (NSA). FIG. 5A is an image generated from an echo acquired at time $-\Delta TE$. FIG. 5B is an image generated from an echo acquired at time 0. FIG. 5C is an image generated from an echo acquired at time $\Delta TE$. These images are generated using a regularization that uses a smoothing of the field map.

Figure 6:
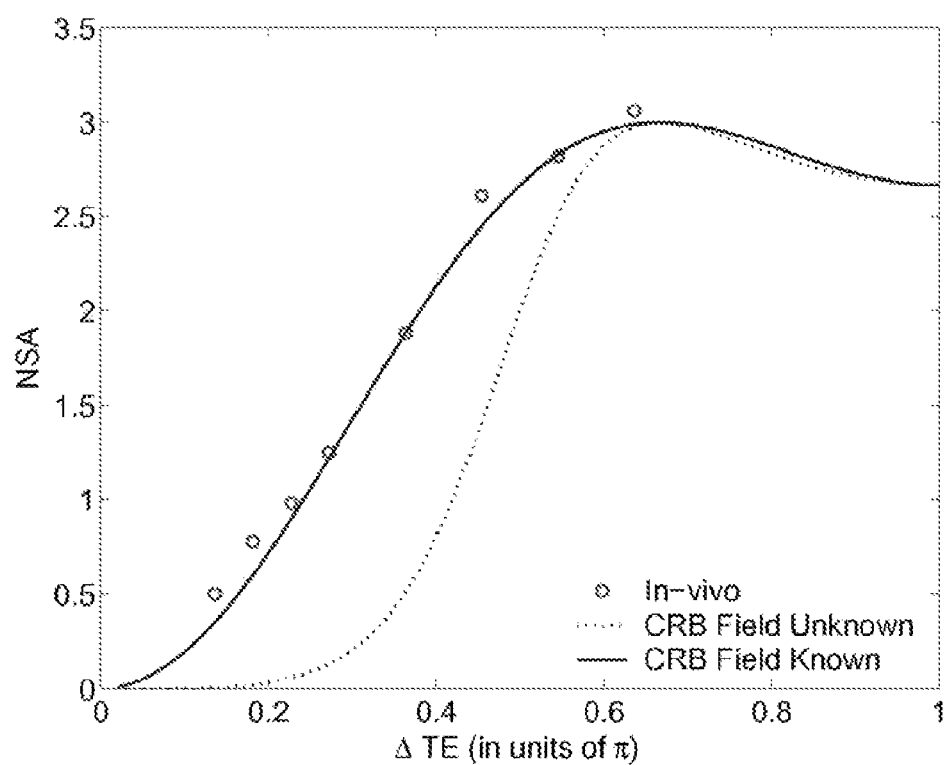
FIG. 6 is a graph of NSA versus TE.

FIG. 6 illustrates another plot of NSA (scale 0-3) vs. $\Delta TE$. In addition to showing plots where CRB field is known and CRB field is unknown, points are generated, as indicated by the circles, using the clinical images of FIG. 5A-C, from an area which was uniformly water. The NSA obtained clinically matched the best possible NSA predicted by theory. If regularization, such as field map smoothing in this case, had not been applied, the best noise performance would have been the CRB field unknown, as indicated by the dotted line. This improvement shows an advantage of regularization.

U.S. patent application Ser. No. 11/738,339 by Scott B. Reeder et al., entitled "MRI METHODS FOR COMBINING SEPARATE SPECIES AND QUANTIFYING A SPECIES" filed concurrently herewith, teaches MRI methods for combining separate species and quantifying a species; U.S. patent application Ser. No. 11/738,340 by Charles A. McKenzie et al., entitled "SELF-CALIBRATION METHODS FOR PARALLEL IMAGING AND MULTIPOINT WATER-FAT SEPARATION METHODS" filed concurrently herewith, teaches self-calibration methods for parallel imaging and multipoint water-fat separation methods; U.S. patent application Ser. No. 11/738,343 by Angel R. Pineda et al., entitled "MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI" filed concurrently herewith, teaches maximum likelihood estimator in the presence of non-identically distributed noise for decomposition of chemical species in MRI; U.S. patent application Ser. No. 11/738,347 by Huanzhou Yu et al., entitled "SLIDING WINDOW RECONSTRUCTION AND PHASE/FIELD MAP UPDATING FOR DYNAMIC CHEMICAL SHIFT IMAGING" filed concurrently herewith, teaches sliding window reconstruction and phase/field map updating for dynamic chemical shift imaging; U.S. patent application Ser. No. 11/738,350 by Huanzhou Yu et al., entitled "SIMULTANEOUS CHEMICAL SPECIES SEPARATION AND $T_2$* MEASUREMENT USING MRI" filed concurrently herewith, teaches simultaneous chemical species separation and $T_2$* measurement using MRI; U.S. patent application Ser. No. 11/738,352 by Charles A. McKenzie et al., entitled "CALIBRATION MAPS FOR PARALLEL IMAGING FREE OF CHEMICAL SHIFT ARTIFACT" filed concurrently herewith, teaches calibration maps for parallel imaging free of chemical shift artifact, all of which are incorporated by reference herein.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating a magnetic resonance images of an object, said object comprised of a plurality of species, comprising:
  a) applying a magnetic resonance imaging excitation;
  b) acquiring a plurality of magnetic resonance image signals, with at least one signal containing information about the plurality of species;
  c) calculating an image of a species of the plurality of species by combining the plurality of image signals iteratively by using a regularized decomposition algorithm.

2. The method as recited in claim 1, wherein the regularized decomposition algorithm is a regularized least squares algorithm.

3. The method as recited in claim 2, wherein the regularized least squares decomposition algorithm uses a priori knowledge for regularization.

4. The method, as recited in claim 2, wherein the regularized least squares decomposition algorithm uses field map smoothing for regularization.

5. The method, as recited in claim 4, wherein the regularization assumes a smooth field map.

6. The method, as recited in claim 5, wherein the field map smoothing comprises linear or nonlinear low-pass filtering of the field map.

7. The method, as recited in claim 6, wherein the low-pass filtering comprises blurring a plurality of pixels.

8. The method, as recited in claim 7, further comprising displaying an image created from combining the plurality of image signals iteratively.

9. The method, as recited in claim 2, wherein the regularized least squares algorithm uses an iterative least-squared decomposition with echo asymmetry and least squares estimation.

10. The method, as recited in claim 9, further comprising displaying an image created from combining the plurality of image signals iteratively.

11. The method, as recited in claim 1, wherein the regularized decomposition algorithm uses maximum likelihood estimation which generalizes a function to be maximized to: P(g|p)+Regularization term, where P(g|p) is the probability of observing the data g from the parameters p.

12. The method, as recited in claim 11, further comprising displaying an image created from combining the plurality of image signals iteratively.

13. The method as recited in claim 1, wherein the regularized decomposition algorithm minimizes $$\sum_{n=1}^{N} \frac{(g_n - S_n(p))^2}{\sigma_n^2} + \text{Regularization Term} \left( a \sum_{n=1}^{N} |p|^2 \right),$$

which comprises a first term, which is a least squares term, and a second term, which is a regularization term.

14. The method as recited in claim 1, wherein the regularized decomposition algorithm minimizes $$\sum_{n=1}^{N} \frac{(g_n - S_n(p))^2}{\sigma_n^2} + \text{Regularization Term} \, (a \cdot f(p, \hat{p})),$$

which comprises a first term, which is a least squares term and a second term, which is a regularization term, where in the second term, p represents parameters to be estimated at a current pixel, while $\hat{p}$ represents parameters from other pixels in an image, and wherein $f(.)$ is a function.

15. The method, as recited in claim 1, further comprising displaying an image created from combining the plurality of image signals iteratively.

16. An apparatus for providing magnetic resonance images, comprising:
   a magnet system;
   a controller electrically connected to the magnet system, comprising:
      a display;
      at least one processor; and
      computer readable media, comprising:
         computer readable code for signaling the magnetic system to apply a magnetic resonance imaging excitation;
         computer readable code for signaling the magnetic system to acquire a plurality of magnetic resonance image signals;
         computer readable codes for combining the plurality of image signals iteratively by using a regularized decomposition algorithm; and
         computer readable code for displaying an image created from combining the plurality of image signals iteratively.

17. The apparatus as recited in claim 16, wherein the computer readable code for combining the plurality of image signals iteratively by using the regularized decomposition algorithm uses a regularized least squares algorithm.

18. The apparatus as recited in claim 16, wherein the computer readable code for combining the plurality of image signals iteratively by using the regularized decomposition algorithm minimizes $$\sum_{n=1}^{N} \frac{(g_n - S_n(p))^2}{\sigma_n^2} + \text{Regularizaiton Term} \, (a \cdot f(p, \hat{p})),$$

which comprises a first term, which is a least squares term and a second term, where is a regularization term, where in the second term, p represents parameters to be estimated at a cunent pixel, while $\hat{p}$ represents parameters from other pixels in an image, and wherein $f(.)$ is a function.

19. The apparatus as recited in claim 16, wherein the computer readable code for combining the plurality of image signals iteratively by using the regularized decomposition algorithm uses maximum likelihood estimation.

20. The method, as recited in claim 1, wherein the combining the plurality of image signals iteratively by using a regularized decomposition algorithm uses regularization for each iteration.

* * * * *